(12) United States Patent
Wright et al.

(10) Patent No.: US 12,476,440 B2
(45) Date of Patent: Nov. 18, 2025

(54) MODULAR POWER SUPPLY SYSTEM AND DEVICE

(71) Applicant: MA Federal, Inc., Reston, VA (US)

(72) Inventors: Terry A. Wright, Seffner, FL (US); Randall M. Lyons, II, Tampa, FL (US)

(73) Assignee: MA Federal, Inc., Reston, VA (US)

( * ) Notice: Subject to any disclaimer, the term of this patent is extended or adjusted under 35 U.S.C. 154(b) by 0 days.

(21) Appl. No.: 19/092,874

(22) Filed: Mar. 27, 2025

(65) Prior Publication Data

US 2025/0316964 A1    Oct. 9, 2025

Related U.S. Application Data

(60) Provisional application No. 63/573,829, filed on Apr. 3, 2024.

(51) Int. Cl.
*H02B 1/26* (2006.01)
*H02B 1/20* (2006.01)
*H02M 7/00* (2006.01)

(52) U.S. Cl.
CPC ............ *H02B 1/26* (2013.01); *H02B 1/20* (2013.01); *H02M 7/003* (2013.01)

(58) Field of Classification Search
None
See application file for complete search history.

(56) References Cited

U.S. PATENT DOCUMENTS

| | | |
|---|---|---|
| D211,952 S | 8/1968 | Ettinger |
| 4,980,800 A | 12/1990 | Furuta |
| 5,113,686 A | 5/1992 | Kawahara |
| 5,969,965 A * | 10/1999 | Byrne ............... H05K 7/14325 363/146 |
| 5,993,241 A | 11/1999 | Olson et al. |
| 6,912,133 B2 * | 6/2005 | Kazem ............... H05K 7/1432 361/752 |
| 7,289,343 B2 * | 10/2007 | Rodriguez ............ H02M 7/003 307/147 |
| 7,365,964 B2 | 4/2008 | Donahue, IV |
| 7,626,356 B2 | 12/2009 | Elgie et al. |
| 9,553,404 B2 | 1/2017 | Simpson et al. |

(Continued)

FOREIGN PATENT DOCUMENTS

| | | |
|---|---|---|
| CN | 202384802 U | 8/2012 |
| CN | 206517084 U | 9/2017 |

(Continued)

*Primary Examiner* — Courtney L Smith
(74) *Attorney, Agent, or Firm* — Williams Mullen; Thomas F. Bergert (57) ABSTRACT

Embodiments of the present disclosure provide a modular power supply (MPS) system and device providing an ability for all-in-one or most-in-one device configurations. In various embodiments, the available components include Direct Current (DC) to Alternating Current (AC) power supply, DC to DC power supply, AC to DC power supply, system health monitoring solutions, power distribution solutions, common, toolless interfaces and universal packaging and mounting. Embodiments include a control module, at least one power module, an inverter module, a power distribution unit module, a signal interface and a mechanical interface to facilitate use and operation of the device as an integrated unit.

21 Claims, 7 Drawing Sheets

(56) References Cited

U.S. PATENT DOCUMENTS

| | | |
|---|---|---|
| 11,509,149 B2 | 11/2022 | Yamamoto et al. |
| 11,894,935 B2 | 2/2024 | Boemi |
| 2022/0013995 A1* | 1/2022 | Rainbow .............. H05K 7/1457 |
| 2022/0181904 A1 | 6/2022 | Ingemi et al. |
| 2023/0349984 A1 | 11/2023 | Cummings et al. |
| 2024/0204681 A1* | 6/2024 | Lyons ................ H05K 7/14329 |
| 2024/0206135 A1* | 6/2024 | Kosteva ................ H02M 7/003 |

FOREIGN PATENT DOCUMENTS

| | | |
|---|---|---|
| CN | 113394875 A | 9/2021 |
| CN | 214674940 U | 11/2021 |
| CN | 115333225 A | 11/2022 |
| CN | 115390489 B | 4/2023 |
| CN | 219360863 U | 7/2023 |
| WO | 2019/170471 A1 | 2/2019 |

\* cited by examiner

MODULAR POWER SUPPLY SYSTEM AND DEVICE

CROSS-REFERENCE TO RELATED APPLICATIONS

This application claims priority to U.S. Provisional Patent Application No. 63/573,829 filed on Apr. 3, 2024, the disclosure of which is incorporated by reference herein in its entirety.

FIELD OF THE INVENTION

The present disclosure relates to power supply, and more particularly to a modular power supply system and device.

BACKGROUND AND SUMMARY

Military compliant commercial off-the-shelf (COTS) power solutions exist, but in a wide variety of size, weight and power (SWaP) footprints, lack input/output (I/O) standards (e.g., connectors, gender) and rarely offer mounting solutions. Existing COTS solutions are typically oversized and void of desired features, e.g., power distribution, health monitoring, remote disconnect, DC/AC inversion, adaptability, scalability, etc. Integrating these into today's COTS solutions can require a lengthy research, development, time and expense effort to tailor form-fit-function.

Embodiments of the present disclosure provide a Modular Power Supply (MPS) system and device that can be kitted to any mobile application. For example, systems mounted in an ultralight (side-by-side) require a much smaller supply due to SWAP and cost constraints. In that case, one may just need power conditioning and/or distribution as the platform according to embodiments of the present disclosure can support 12, 24 and 28 VDC. A larger platform such as a Mine Resistant Ambush Protected (MRAP), Joint Light Tactical Vehicle (JLTV), Shelter, etc., may require a robust power solution of high wattage and multiple levels which requires a conditioner along with step transformers. Embodiments of the MPS system and device of the present disclosure provide a customizable and robust solution permitting modules to be easily attached together to support any mission.

DETAILED DESCRIPTION OF EMBODIMENTS

The presently disclosed subject matter now will be described more fully hereinafter with reference to the accompanying drawings, in which some, but not all embodiments of the presently disclosed subject matter are shown. Like numbers refer to like elements throughout. The presently disclosed subject matter may be embodied in many different forms and should not be construed as limited to the embodiments set forth herein; rather, these embodiments are provided so that this disclosure will satisfy applicable legal requirements. Indeed, many modifications and other embodiments of the presently disclosed subject matter set forth herein will come to mind to one skilled in the art to which the presently disclosed subject matter pertains having the benefit of the teachings presented in the foregoing descriptions and the associated drawings. Therefore, it is to be understood that the presently disclosed subject matter is not to be limited to the specific embodiments disclosed and that modifications and other embodiments are intended to be included within the scope of the appended claims.

It will be appreciated that reference to "a", "an" or other indefinite article in the present disclosure encompasses one or a plurality of the described element. Thus, for example, reference to a module may encompass one or more modules, reference to a mechanical interface may encompass one or more mechanical interfaces, and so forth.

With reference to FIGS. 1 through 14, the present disclosure pertains to a rugged, modular power supply (MPS) system, device and method providing an ability for all-in-one or most-in-one device configurations. In various embodiments, the available components include Direct Current (DC) to Alternating Current (AC) power supply, DC to DC power supply, AC to DC power supply, system health monitoring solutions, power distribution solutions, common, toolless interfaces and universal packaging and mounting. The presently described modular device alleviates the time, cost and risk of individual product selections, ensures component compatibility, interoperability, configurability, and control, reduces device footprint, cabling, power consumption, and thermal load and is reusable, scalable, and adaptable.

As shown in the embodiment of FIGS. 1 through 5, the MPS device 10 can include a control module 12, power modules 14, 16, 18, an inverter module 20 and a power distribution unit (PDU) module 22. These modules 12, 14, 16, 18, 20, 22 are mechanically connectable in series via various mechanical connections, embodiments of which are discussed elsewhere herein. In various embodiments, these modules 12, 14, 16, 18, 20, 22 are of similar form factors at least with regard to height and depth, and the width of each module may be dependent upon required physical space to accommodate inputs, outputs, features and functions of each respective module. For example, DC power modules (e.g., with 400 W-600 W output) may be slightly wider than AC power modules (e.g., with 500 W output).

The core capabilities of the control module 12 include power inputs, stepping, conditioning, and switching. In various embodiments, the control module 12 also contains input circuit breakers for alternating current (AC) and direct current (DC). According to various embodiments, the control module 12 is the core input/output interface (vehicle battery input, external direct current (DC) input, and external alternating current (AC) input), external power circuit interrupt protection (AC breaker, DC breaker), and signal interface control and supply for the MPS device 10.

The power modules 14, 16, 18 are intermediate modules that provide increased capacity for both AC and DC, at 500 watts and 400 watts, respectively, and by way of example. In various embodiments, these modules are stackable up to a total of 2,500 watts. It will be appreciated that the power module component(s) for a given deployment can be one or more different power modules including one or more AC power modules and/or one or more DC power modules. In the embodiment shown in FIGS. 1 through 5, power modules 14, 16 are AC power modules and power module 18 is a DC power module. The power modules are operable to provide AC and DC output capacity scalability.

The inverter module 20 and the PDU module 22 provide the final outputs. Output types include AC, DC, and system health monitoring, for example. In various embodiments, the inverter module 20 is operable to convert inputted power from the control module 12 and/or power modules (e.g., 14, 16 and/or 18) to 110 volt AC output (110 VAC) and USB DC output, initiate vehicle battery circuit interrupt from the control module 12, initiate MPS device 10 bypass to direct link vehicle battery to the PDU module 22, monitor power subsystem health and report status via Simple Network Management Protocol (SNMP) traps, capture, record and display system runtime data, and charge batteries, for example. In various embodiments, the inverter module 20 consolidates the 110 VAC outlet(s) and display 35 into the module. In various other embodiments, the inverter module 20 only has connectors so the outlets and display can be remotely mounted and operated.

In various embodiments, system health can be broadcast over TCP/IP via SNMP traps which can be received, deciphered, and fed into an overarching management system or simply displayed on a screen, such as display 35, for example. Traps denote such information as power supply AC and DC inputs and outputs (type, level, amperage, and active), and PDU inputs and outputs (e.g., breaker one, two, three, etc.), for example.

The PDU module 22 divides total DC output power into individual circuit breaker protected circuits, e.g., one through six in the exemplary embodiment of the device 10 shown in FIGS. 1 through 5. In various embodiments, the PDU module 22 is operable to divide total output power into one or more individual circuit breaker protected channels, initiate control module master power circuit interrupt and employ system health sensors for the inverter module 20.

Figure 5:
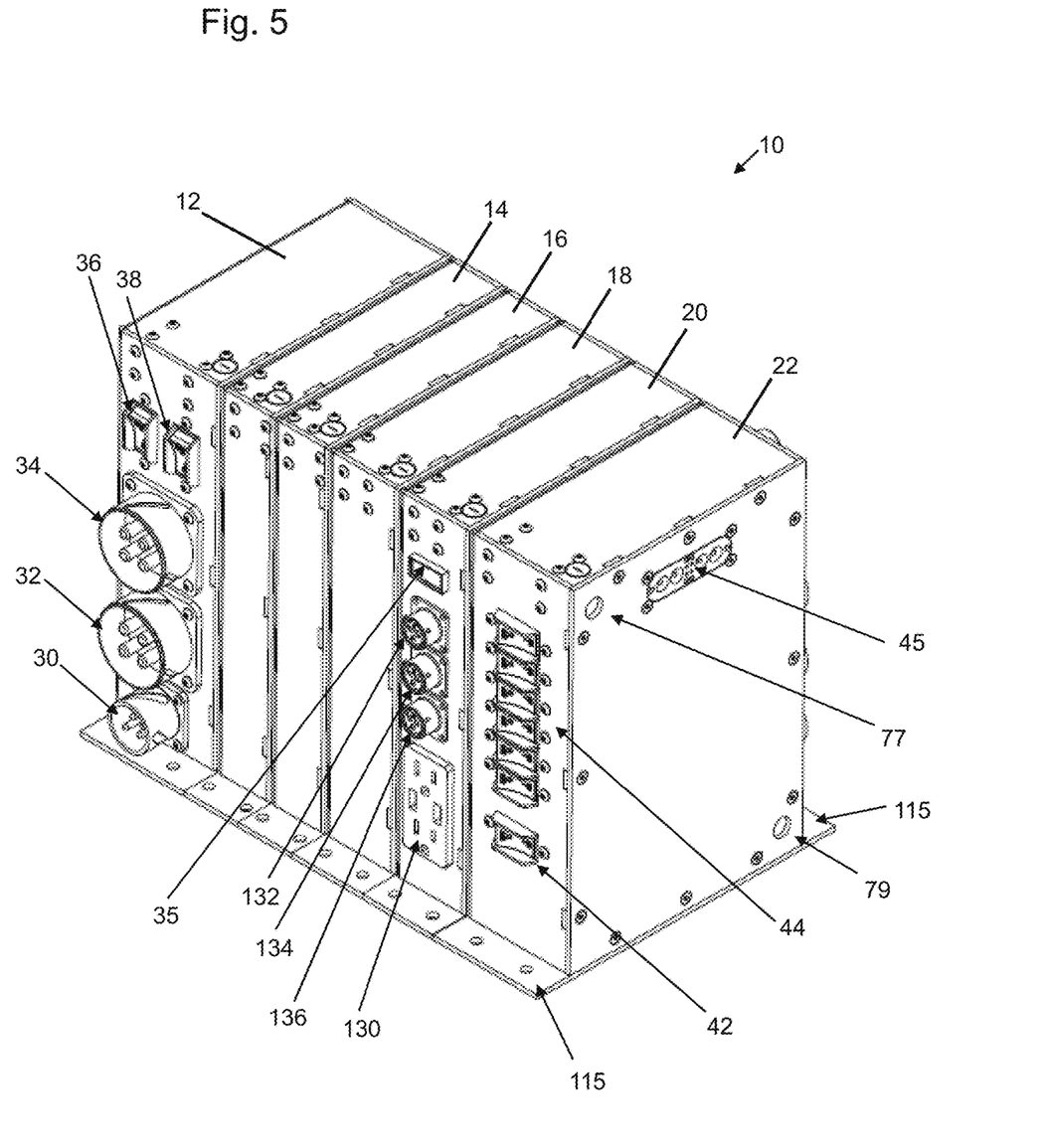
FIG. 5 is a perspective view of the embodiment of the device according to FIG. 1.

As shown in FIGS. 1 and 3 through 5, the control module 12 can be provided with different interfaces on its front face 50. For example, an AC input 30, a DC input 32, a vehicle DC input 34, an AC breaker switch 36 and a DC breaker switch 38 are shown on the front face 50 of the control module 12. It will be appreciated that the vehicle DC input 34 is operable to receive power from a vehicle to which the MPS device is connected. As further shown in FIG. 1, the front face 52 of the inverter module 20 can be provided with one or more interfaces 33 and display 35, and the front face 54 of the PDU module 22 can be provided with a main breaker 42 and one or more DC output breakers 44. Examples of the interfaces 33 on the inverter module 20 are shown in FIG. 5, where elements 130 represent 110 volt AC output (110 VAC) and USB DC output, element 132 represents a remote disconnect switch input, element 134 represents a solar and/or alternative energy input and element 136 represents an output such as an Ethernet output which may send SMTP traps over a local area network (LAN), for example. It will be appreciated that elements 132, 134 and 136 can be configured as a single unit instead of three distinct units as shown in FIG. 5 in various embodiments of the present disclosure.

In various embodiments, the device 10 operates on 28 volts (V)±3 V direct current (DC) for prime power from an external source such as a vehicle electrical system. The device 10 can further operate on AC power input of 110 V±20 V, 60 hertz (Hz)±3 Hz single phase for prime power from an external source. The device 10 can further operate on AC power input of 220 V±20 V, 55 Hz±8 Hz single phase for prime power from an external source.

Figure 1:
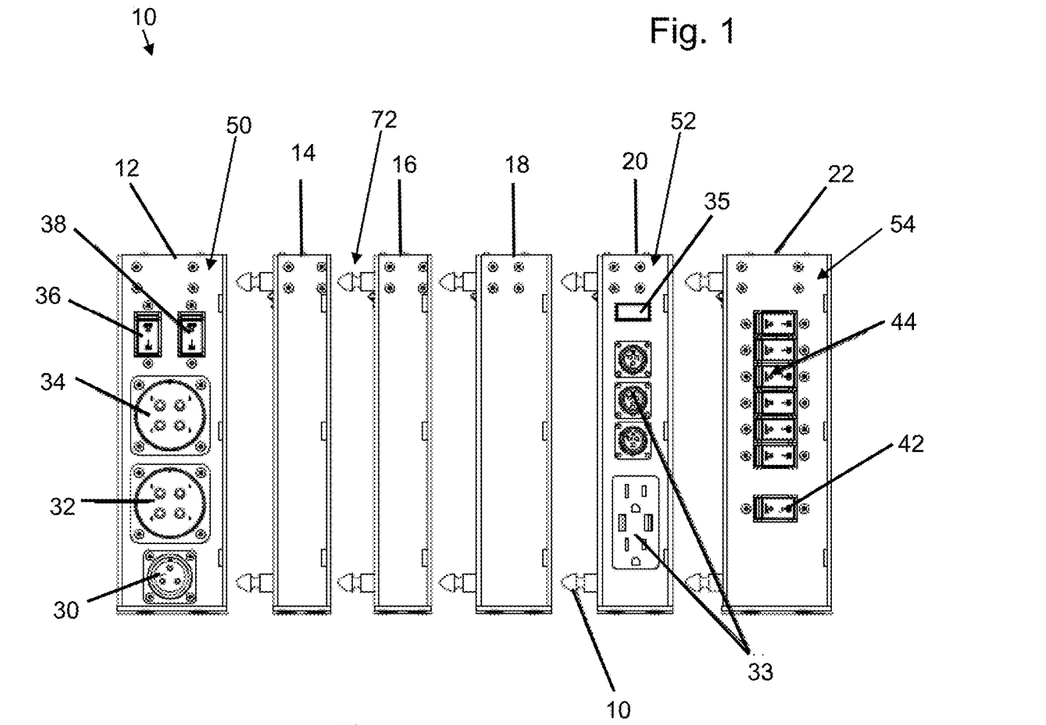
FIG. 1 is a front exploded schematic view of an embodiment of the device according to the present disclosure.
Figure 2:
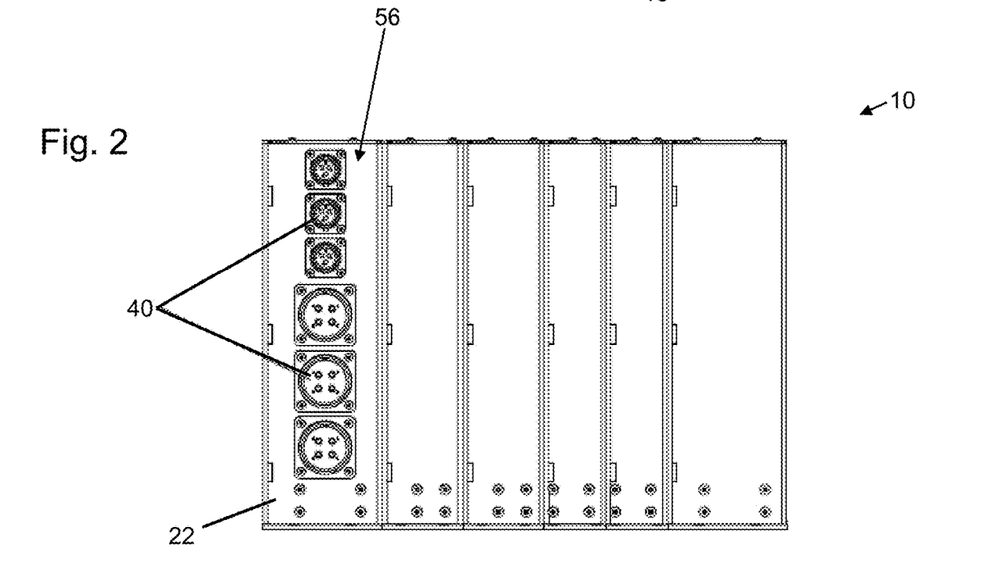
FIG. 2 is a back view of the embodiment of the device according to FIG. 1.

As shown in FIG. 2, the PDU module 22 can be provided with one or more connectors and/or interfaces on its back face 52. For example, various DC outputs 40 are shown on the back face 52 of the PDU 22.

In various embodiments, the device 10 includes a power by-pass switch (PBS) to provide a direct connection between the vehicle power system and the power distribution panel 22, allowing the system to bypass power supply and to operate on battery power in emergency situations. Embodiments of the device 10 can display the status of input power (i.e., shore, generator, battery) and visibly alert the operator when the power status changes through display 35, for example. Embodiments of the device 10 protect personnel from inadvertent contact with voltages capable of producing a shock hazard and against electromagnetic radiation hazards.

As will be appreciated, the device 10 in FIGS. 1 through 5 has its functionality and capacity decomposed into a modular format, where power stepping, conditioning, inversion, monitoring, distribution, and control are presented together in one device 10.

Figure 3:
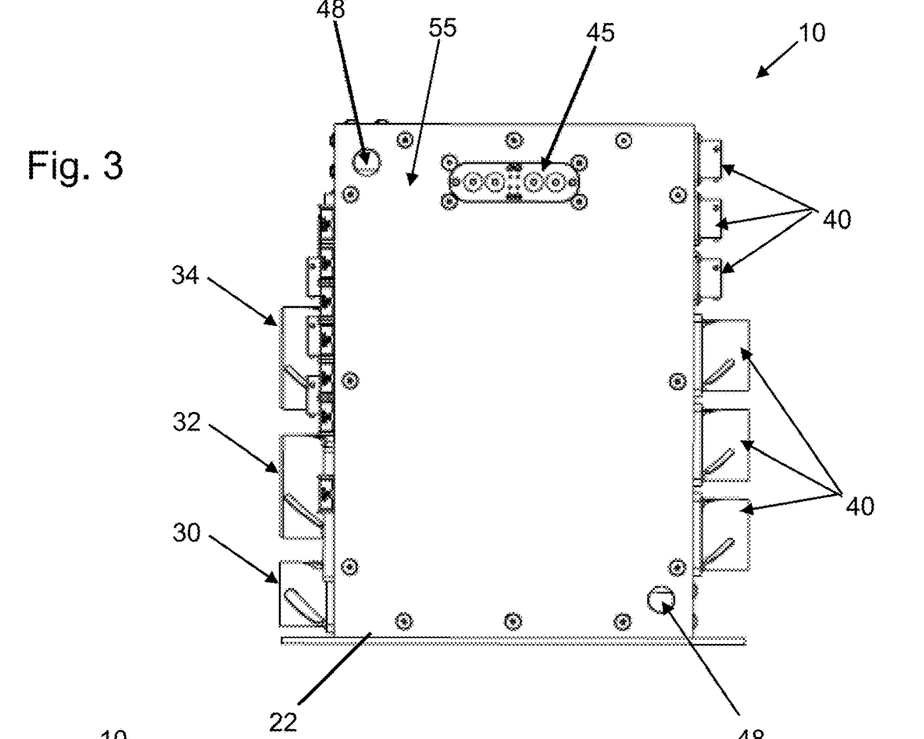
FIG. 3 is a right-side view of the embodiment of the device according to FIG. 1.
Figure 4:
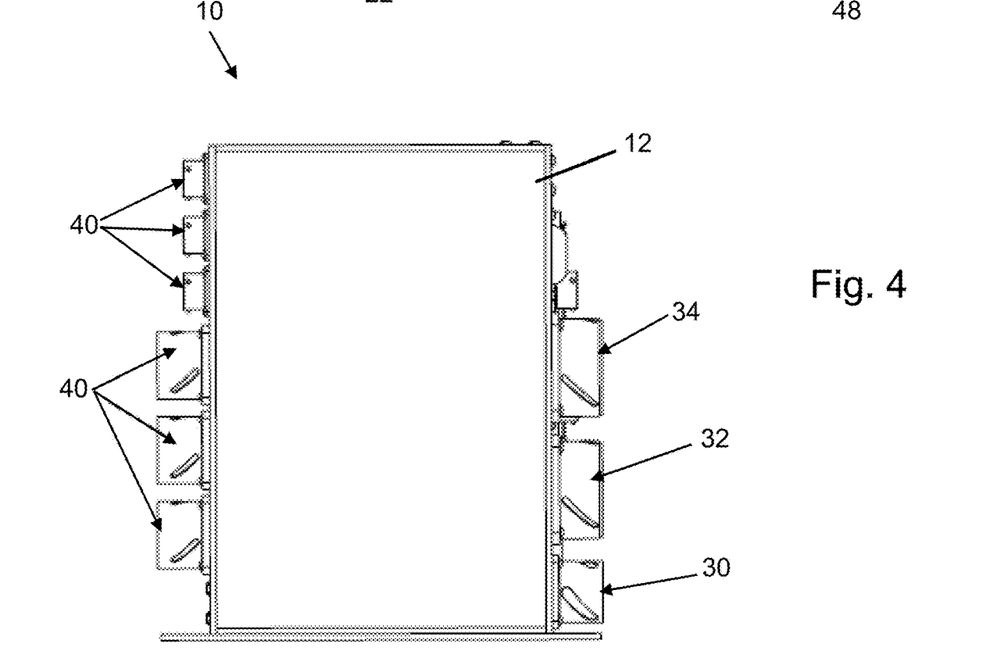
FIG. 4 is a left side view of the embodiment of the device according to FIG. 1.
Figure 8:
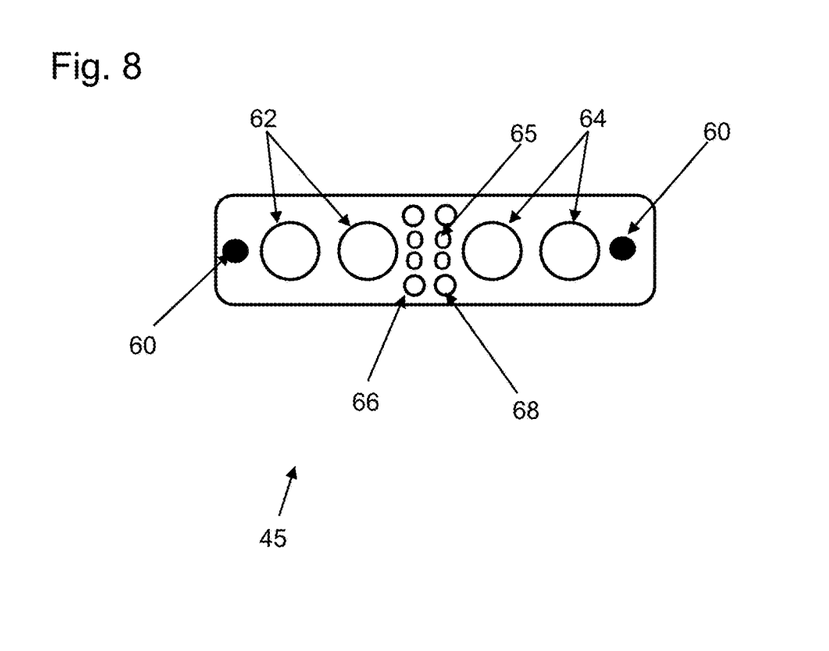
FIG. 8 is a schematic diagram of a signal interface according to embodiments of the present disclosure.
Figure 9:
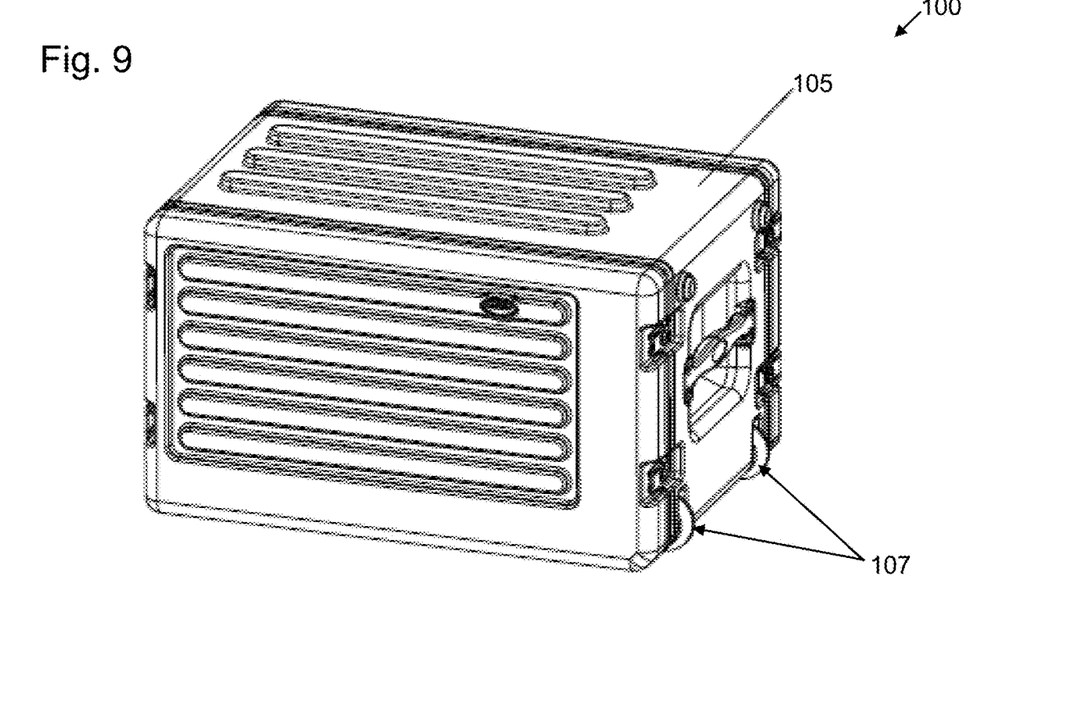
FIG. 9 is a perspective view of a mounting kit according to embodiments of the present disclosure.

In various embodiments such as shown in FIGS. 3 and 5, a signal interface 45 is provided on a right side face 55 of PDU module 22. The signal interface 45 provides a highbred passthrough connector solution to interface the various modules. The signal interface 45 consolidates all power and signal interfaces into a single assembly, enables rapid configuration and reconfiguration of the MPS device 10. In various embodiments, the signal interface 45 employs index pins to ensure proper, consistent, alignment of all connectors and eliminates shock hazards by isolating electrical circuits from operators. As shown in FIG. 8, signal interface 45 can provide alignment pins 60 for registration with the device 10. Bias, positive high-power (e.g., 2×6 AWG) is indicated at 62, bias, negative high-power (e.g., 2×6 AWG) is indicated at 64, bias, positive medium-power (e.g., 2×16 AWG) is indicated at 66, bias, negative medium-power (e.g., 2×16 AWG) is indicated at 68 and signal (e.g., 4×20 AWG) is indicated at 65.

In various embodiments, the signal interface comprises at least two index pins, standardizes module to module signal interface and printed circuit board (PCB) interface/interconnections within each module of the device 10, regardless of configuration. In various embodiments, the PCB may vary in length to accommodate different module depths, for example.

FIGS. 1, 3, 5, 6 and 7 show embodiments of a mechanical interface 70 according to embodiments of the present disclosure. The mechanical interface 70 is an indexing and latching mechanism for connecting the various modules (e.g., 12, 14, 16, 18, 20, 22) of the device 10. In various embodiments, the mechanical interface 70 is operable to physically connect two or more of the control module, the plurality of power modules, the inverter module and the power distribution module. This physical connection can form a series of connected units as illustrated in FIGS. 2 and 5, for example.

Figure 6:
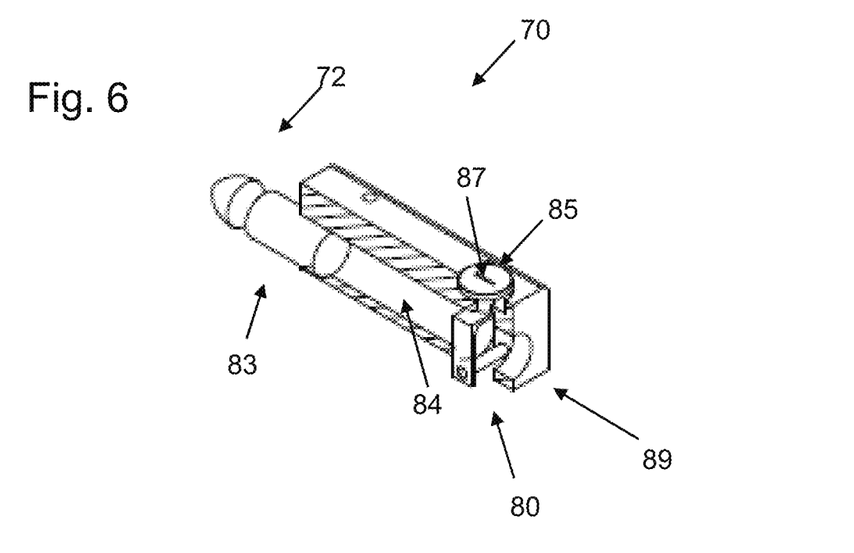
FIG. 6 is a perspective view in partial cross-section of a mechanical interface according to embodiments of the present disclosure.
Figure 7:
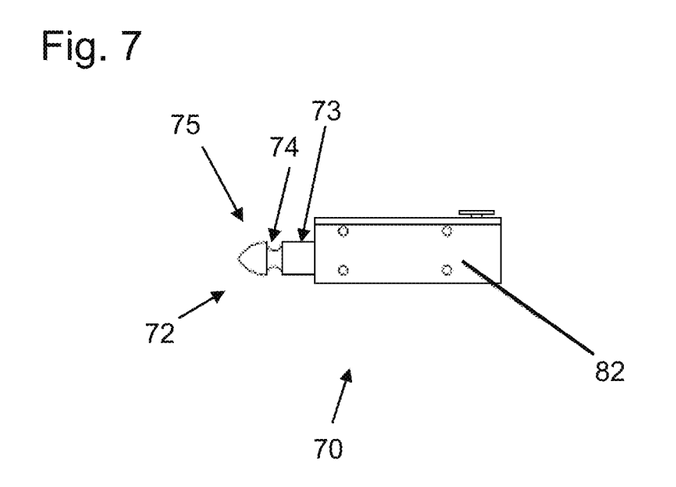
FIG. 7 is a front view of a mechanical interface according to embodiments of the present disclosure.

The mechanical interface 70 ensures precise, secure attachment of modules in any MPS configuration. The mechanical interface 70 can be provided as a wall member 82 having a slot 84 formed therein for maintaining a guide pin 72 at one end 83 and a slot catch 80 at the other end 89. The wall member 82 can be secured to an internal wall of a module through mechanical means so that the wall member 82 is retained within the body of the module to which it is secured, while the guide pin 72 extends outwardly of the body of the module to which the wall is secured. As shown in FIG. 7, the guide pin 72 can be provided with a body 73, neck 74 and head 75. In various embodiments, a single guide pin 72 from one module ensures accurate alignment with a slot catch 80 from an adjoining module, wherein the slot catch prevents separation from the guide pin 72 when fully inserted. The catch 80 can be positioned within an opening 48 in the wall and/or body of the module as shown in FIG. 5. When the guide pin head 75 is inserted in the opening 48 of a neighboring module, the guide pin head 75 extends into the slot 84 at end 89 of the neighboring module, at which time the catch 80 securely holds the neck 74 of the guide pin 72. In some embodiments, the catch 80 may be spring loaded such that pushing the head 75 of the guide pin 72 through the catch 80 pushes the catch back, and after the head 75 is inserted far enough, the catch 80 springs back to securely hold the neck 74 of the guide pin 72. In such embodiments, a button (e.g., element 85) may be positioned above the wall member 82 of the mechanical interface 70 and may operably engage the spring, such that pushing the button retracts the spring to release the catch's hold on the guide pin 72, thereby allowing the module with the guide pin 72 to be removed from the neighboring module. This permits rapid, toolless execution utilizing a single push-button locking and unlocking actuator. In various other embodiments, a key lock arrangement (e.g., element 85) is employed instead of a button and spring, whereby inserting a key in a keyhole permits engagement and disengagement of the detent 80 with the guide pin 72 to facilitate connection and disconnection of adjacent modules according to the present disclosure. In this embodiment, the hole shown at 87 in FIG. 6 represents the keyhole, although it will be appreciated that a hole 87 is not required in all embodiments of the present disclosure.

In various embodiments, each module is provided with two mechanical interfaces 70 nested adjacent opposing corners (e.g., corners 77, 79 of PDU module 22 in FIG. 5). Thus, in such embodiments, each module has two guide pins 72 extending from one side surface and two openings 48 positioned on the opposite side surface for receiving guide pins of a module to be connected. The alignment pin can be removed from the first module in the stack (e.g., the control module 12 in FIGS. 1 through 5), leaving only the receiver openings according to various embodiments. It will be appreciated that embodiments of the mechanical interface 70 can vary in length depending upon the width of the module(s) into which each is incorporated.

Thus, as disclosed herein, embodiments of the mechanical interface 70 can include a plurality of guide pins 72, wherein a respective one of the plurality of guide pins is secured to each of the power modules, the inverter module and the power distribution unit module, but as in the example above and shown in FIGS. 1 through 5, not to the control module, as the control module is the first module in the stack and does not require connection opposite the power module side. It will be appreciated that each of the control module, plurality of power modules, inverter module and power distribution unit module can be formed with an opening 48 for receiving one of the plurality of guide pins as described elsewhere herein.

It will be appreciated that embodiments of the mechanical interface 70 according to the present disclosure provide a one-size-fits-all, dual gender mechanism with one side being a socket or receiver with locking mechanism and the other side containing an alignment pin such as guide pin 72. As described elsewhere herein, two mechanical interfaces 70 can be incorporated into opposing corners of modules and can be universally configured to mount without modification or special hardware.

In various embodiments, the MPS device 10 can be provided with or as part of a Universal Mounting Kit (UMK) 100 providing several modes of physical security ranging from carry-on, to strap in, to hard mount. As shown in FIGS. 9 through 14, embodiments of the UMK 100 can be a transit case 105 able to contain up to a fully configured MPS device 10, a partially configured MPS device 10 (e.g., control module 12, inverter module 20, PDU module 22 from FIG. 1) and/or a minimally configured MPS device (e.g., control module 12 and PDU module 20 from FIG. 1). The MPS device 10 can be stowed, transported, and operated from the ruggedized transit case 105. In various embodiments, the transit case 105 is provided with rollers 107 for ease of transport.

Figure 11:
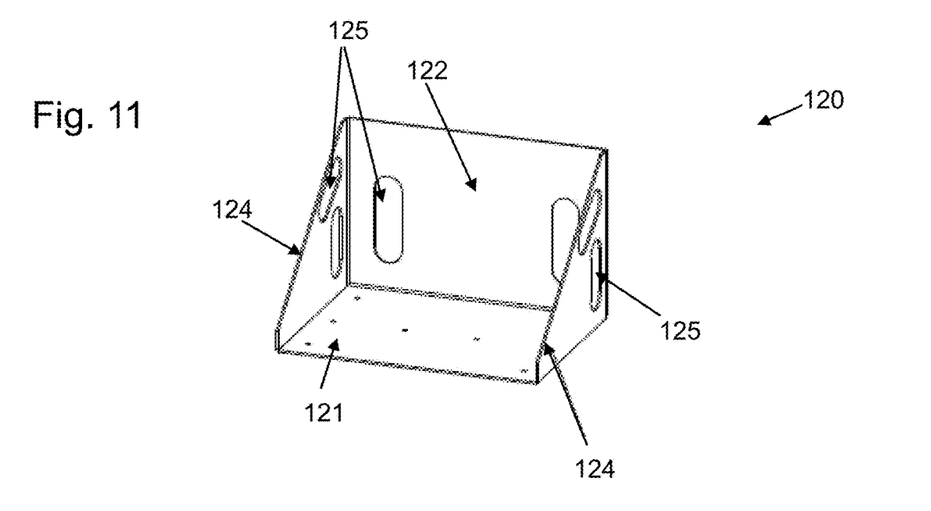
FIG. 11 is a perspective view of a belt harness of a mounting kit according to embodiments of the present disclosure.

As shown in FIG. 11, a seat belt mount 120 can be employed to support expedient on-the-move (OTM) security and operation of the MPS device 10. In various embodiments, the seat belt mount 120 includes a base support 121, a back wall 122 and a pair of side walls 124, wherein the back wall 122 and side walls 124 are formed with slots 125 to permit one or more belts or straps to be inserted through in order to secure the seat belt mount 120 to another item such as a vehicle, for example. It will be appreciated that the base support 121 can also or alternatively be secured to a surface, such as with appropriate hardware as will be appreciated by those of ordinary skill in the art.

Figure 12:
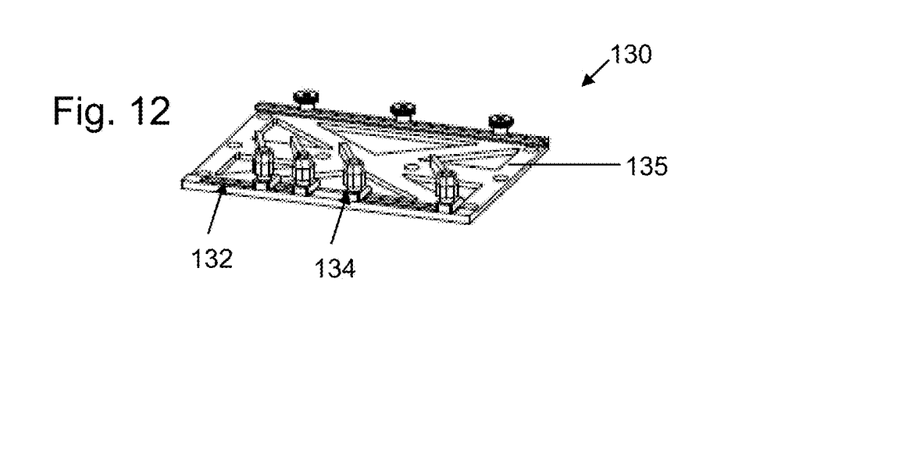
FIG. 12 is a perspective view of base plate of a mounting kit according to embodiments of the present disclosure.

As shown in FIG. 12, a base plate 130 can be provided as part of UMK 100 for potential hard mounting of the MPS device 10. The base plate 130 allows mounting the MPS device 100 to a vehicle or other platform, including the seat belt mount 120, while still supporting the toolless reconfiguration of the MPS device 10, whether the MPS device 10 is provided in two, three, seven or other number of modules. Each module can be provided with one or more platform extensions or flanges (see, e.g., 115 in FIG. 5), which can be retained by one or more quick-release latches 134 secured to the base plate 130. In various embodiments, the base plate 130 is provided with one or more rails 132 which can align with the platform flange(s) 115 of each module and/or the MPS device 10, with quick-release latches retained within the one or more rails 132 and operable to securely maintain the flange(s) 115 between the latches and the base surface 135 of the base plate 130, as shown in FIG. 13.

Figure 13:
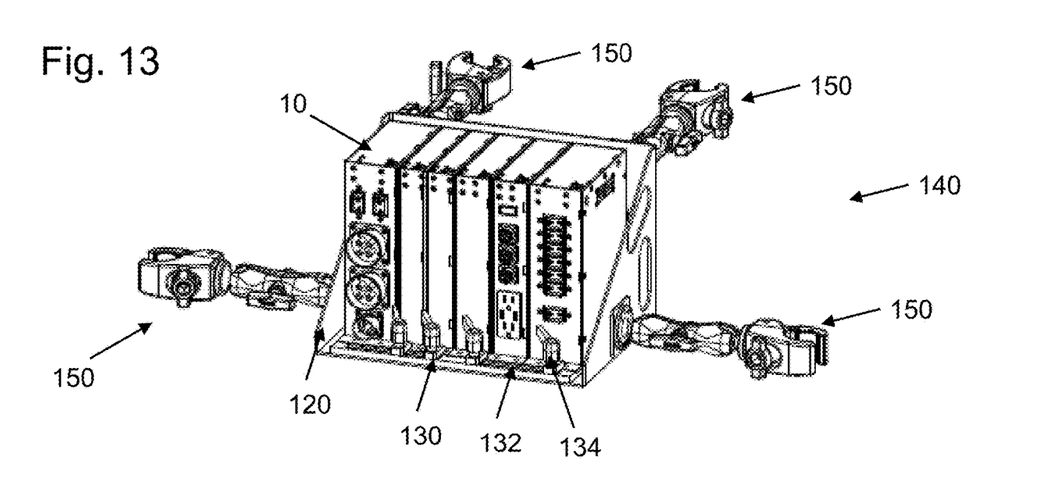
FIG. 13 is a perspective view of a roll bar mount of a mounting kit according to embodiments of the present disclosure
Figure 14:
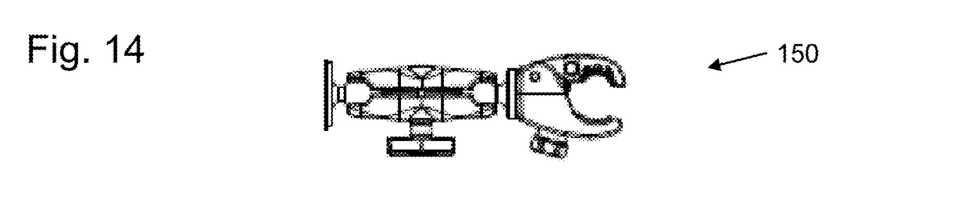
FIG. 14 is a side view of a roll bar mount clamp according to embodiments of the present disclosure.

As shown in FIGS. 13 and 14, one or more roll bar mount clasps 150 can be provided as a roll bar mount device or system 140 for securing the UMK 100 and MPS device 10 to vehicles including on light and ultra-light tactical vehicles, for example. The clasps 150 have multi-axis rotation capabilities and allow positioning on a vehicle in multiple ways. As shown in FIG. 13, four clasps 150 are provided and are secured to seat belt mount 120, which is shown with base plate 130 maintained therein. In various embodiments, the roll bar mount 140 is a combination of the base plate 130 secured to the base support 121 of the seat belt mount 120, with one or more roll bar mount clasps 150 secured to one or more walls (e.g., 122, 124) of the seat belt mount 120.

Figure 10:
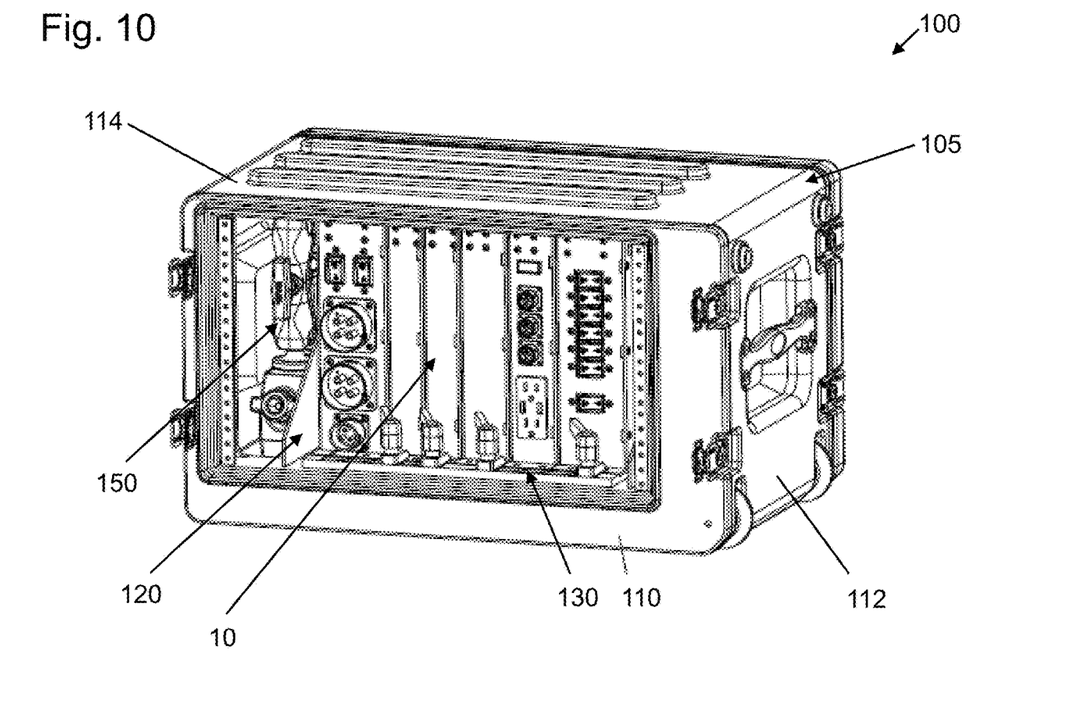
FIG. 10 is a perspective view of the mounting kit of FIG. 9 with the front face removed according to embodiments of the present disclosure.

In each of the above ways and embodiments, the UMK 100 is operable to stow, transport, mount, and operate the MPS device 10. In various embodiments, the UMK 100 can stow the MPS device 10, the base plate 130, the seat belt mount 120 and the roll bar mount 140 and/or clasps 150 together, such that the UMK 100 can be transported and used in a variety of implementations and environments regardless of which mount or combination of mounts of the UMK is employed. In such embodiments, as illustrated in FIG. 10, for example, the modular power supply device 10, the base plate 130, the seat belt mount 120 and the roll bar mount and/or roll bar mount clamps 150 are maintained within the transit case 105.

In various embodiments, the UMK 100 and/or the MPS device 10 can incorporate solar inputs and battery charging capabilities.

The present disclosure contemplates a variety of different systems each having one or more of a plurality of different features, attributes, or characteristics. A "system" as used herein can refer to various configurations of: one or more modules; two or more modules connected by one or more mechanical interfaces; two or more modules implementing a signal interface as described herein; one or more modules and optional signal interface(s) and mechanical interface(s) within a Universal Mounting Kit; one or more modules securable to a UMK surface mount embodiment, seat belt mount embodiment and/or roll bar mount embodiment, and various combinations of the modules, signal interface, mechanical interface and mounting kits or devices as described herein.

It will be appreciated that the components of the presently disclosed device can be fabricated from various types of materials, including aluminum, steel, carbon fiber, plastic and/or other suitable materials consistent with the environments in which the device and/or system can operate.

Embodiments of the present disclosure may be embodied in other specific forms without departing from the spirit or essential characteristics thereof. The present embodiments are therefore to be considered in all respects as illustrative and not restrictive, the scope of the present disclosure being indicated by the claims of the application rather than by the foregoing description, and all changes which come within the meaning and range of equivalency of the claims are therefore intended to be embraced therein.

The invention claimed is:

1. A modular power supply device, comprising:
    a control module;
    a plurality of power modules;
    an inverter module, wherein the inverter module comprises a visual display;
    a power distribution unit module;
    a signal interface comprising at least two index pins, standardizing signal interface and printed circuit board interconnections and operable to consolidate signal processing between the control module, the plurality of power modules, the inverter module and the power distribution unit module; and
    a mechanical interface operable to physically connect at least two of the control module, the plurality of power modules, the inverter module and the power distribution module.

2. The device of claim 1, wherein the mechanical interface comprises a wall member having a slot formed therein, a guide pin maintained within the slot at a first end of the slot, and a slot catch maintained within the slot at a second end of the slot.

3. The device of claim 2, wherein the wall member is secured within at least one selected module from the group comprising: at least one of the plurality of power modules, the inverter module and the power distribution unit module.

4. The device of claim 3, wherein the guide pin extends outwardly of the at least one selected module.

5. The device of claim 1, wherein the mechanical interface comprises a plurality of mechanical interfaces, with a respective individual mechanical interface of the plurality of mechanical interfaces being secured in each of the control module, the plurality of power modules, the inverter module and the power distribution module.

6. The device of claim 5, wherein the individual mechanical interface secured in the control module comprises a wall member having a slot formed therein, and a slot catch maintained within the slot at an end of the slot.

7. The device of claim 6, wherein the individual mechanical interface secured in each of the plurality of power modules, the inverter module and the power distribution unit module comprises a wall member having a slot formed therein, a guide pin maintained within the slot at a first end of the slot, and a slot catch maintained within the slot at a second end of the slot.

8. The device of claim 7, wherein each of the control module, the plurality of power modules, inverter module and power distribution unit module is formed with an opening for receiving the guide pin.

9. The device of claim 1, wherein each of the control module, the plurality of power modules, the inverter module and the power distribution unit module are formed with an opening therein, and wherein the mechanical interface comprises a plurality of guide pins, wherein a first guide pin is secured to and extends outwardly of the power distribution unit module and into the opening of the inverter module, wherein a second guide pin is secured to and extends outwardly of the inverter module and into the opening of a first one of the plurality of power modules, and wherein a third guide pin is secured to and extends outwardly of a second one of the plurality of power modules and into the opening of the control module.

10. The device of claim 1, further comprising a mounting kit for retaining the device.

11. The device of claim 9, wherein the mounting kit comprises a transit case and wherein the device is retained within the transit case.

12. The device of claim 9, wherein the mounting kit comprises at least one of: a seat belt mount, a base plate and a roll bar mount.

13. The device of claim 1, further comprising a power bypass switch operable to bypass the control module, the plurality of power modules and the inverter module such that the power distribution unit module can receive power directly from an external source.

14. A system, comprising:
a modular power supply device, comprising:
a control module;
an inverter module;
a power distribution unit module;
a signal interface comprising at least two index pins, standardizing signal interface and printed circuit board interconnections and operable to consolidate signal processing between the control module, the inverter module and the power distribution unit module; and
a mechanical interface operable to physically connect the control module, the inverter module and the power distribution module; and
a mounting kit, wherein the modular power supply device is secured within or to the mounting kit, wherein the mounting kit comprises a transit case, a base plate, a seat belt mount and one or more roll bar mount clasps.

15. The system of claim 14, wherein the modular power supply device further comprises a flange, and wherein mounting kit comprises a base plate having at least one latch secured thereto, wherein the modular power supply device is secured to the base plate via the at least one latch.

16. The system of claim 15, wherein the base plate comprises a rail to which the at least one latch is secured.

17. The system of claim 14, wherein the modular power supply device, the base plate, the seat belt mount and the one or more roll bar mount clasps are maintained within the transit case.

18. The system of claim 14, wherein the modular power supply device further comprises a power module, wherein the signal interface is further operable to consolidate signal processing between the power module, the control module, the inverter module and the power distribution unit module, and wherein the mechanical interface is further operable to physically connect the power module, the control module, the inverter module and the power distribution module.

19. A modular power supply device, comprising:
a control module;
a plurality of power modules;
an inverter module;
a power distribution unit module;
a signal interface comprising at least two index pins, standardizing signal interface and printed circuit board interconnections and operable to consolidate signal processing between the control module, the plurality of power modules, the inverter module and the power distribution unit module;
a mechanical interface operable to physically connect at least two of the control module, the plurality of power modules, the inverter module and the power distribution module; and
a power bypass switch operable to bypass the control module and the inverter module such that the power distribution unit module can receive power directly from an external source.

20. A system, comprising:
a modular power supply device, comprising:
a control module;
an inverter module;
a power distribution unit module;
a signal interface comprising at least two index pins, standardizing signal interface and printed circuit board interconnections and operable to consolidate signal processing between the control module, the inverter module and the power distribution unit module; and
a mechanical interface operable to physically connect the control module, the inverter module and the power distribution module;
a mounting kit, wherein the modular power supply device is secured within or to the mounting kit; and
a power bypass switch operable to bypass the control module and the inverter module such that the power distribution unit module can receive power directly from an external source.

21. A system, comprising:
a modular power supply device, comprising:
a control module;
an inverter module comprising a visual display;
a power distribution unit module;
a signal interface comprising at least two index pins, standardizing signal interface and printed circuit board interconnections and operable to consolidate signal processing between the control module, the inverter module and the power distribution unit module; and
a mechanical interface operable to physically connect the control module, the inverter module and the power distribution module; and
a mounting kit, wherein the modular power supply device is secured within or to the mounting kit.

* * * * *